United States Patent
Rao et al.

(10) Patent No.: US 12,079,689 B1
(45) Date of Patent: Sep. 3, 2024

(54) SYSTEMS AND METHODS FOR LOW-CODE UTILIZATION OF A COMPUTING SYSTEM

(71) Applicant: WELLS FARGO BANK, N.A., San Francisco, CA (US)

(72) Inventors: Abhijit Rao, Irvine, CA (US); Vanio Markov, Ridgewood, NJ (US); Peter Bordow, Fountain Hills, AZ (US)

(73) Assignee: Wells Fargo Bank, N.A., San Francisco, CA (US)

( * ) Notice: Subject to any disclaimer, the term of this patent is extended or adjusted under 35 U.S.C. 154(b) by 162 days.

(21) Appl. No.: 17/366,338

(22) Filed: Jul. 2, 2021

Related U.S. Application Data

(60) Provisional application No. 63/201,453, filed on Apr. 30, 2021.

(51) Int. Cl.
| | |
|---|---|
| *G06N 10/00* | (2022.01) |
| *G06F 8/34* | (2018.01) |
| *G06F 15/16* | (2006.01) |
| *G06N 20/00* | (2019.01) |
| *G06F 3/0484* | (2022.01) |
| *G06F 16/182* | (2019.01) |

(Continued)

(52) U.S. Cl.
CPC .............. *G06N 10/00* (2019.01); *G06F 8/34* (2013.01); *G06F 15/16* (2013.01); *G06N 20/00* (2019.01); *G06F 3/0484* (2013.01); *G06F 16/182* (2019.01); *G06N 3/04* (2013.01); *G06N 5/01* (2023.01); *H03K 19/195* (2013.01)

(58) Field of Classification Search
CPC .......... G06N 10/00; G06N 20/00; G06N 3/04; G06N 5/01; G06F 8/34; G06F 15/16; G06F 16/182; G06F 3/0484; G06F 11/3452; H03K 19/195
See application file for complete search history.

(56) References Cited

U.S. PATENT DOCUMENTS

| | | | |
|---|---|---|---|
| 10,592,216 B1* | 3/2020 | Richardson | ......... G06F 11/3452 |
| 2018/0233133 A1* | 8/2018 | Hilal | ........................ G06N 3/04 |

(Continued)

OTHER PUBLICATIONS

Rose et al, CN 105531725 (translation), Mar. 13, 2018, 77 pgs <CN_105531725.pdf>.*

*Primary Examiner* — Tuan A Vu
(74) *Attorney, Agent, or Firm* — K&L Gates LLP

(57) ABSTRACT

Systems, apparatuses, methods, and computer program products are disclosed for low-code utilization of a computing system involving a classical computing device and a quantum computing device. An example method includes receiving, by formulation circuitry, an input from an interaction modality. The example method includes transmitting, by the formulation circuitry, the input to a machine learning model to produce an intermediate output. The example method includes determining, by the formulation circuitry, a type of computing device needed for based on the intermediate output. The example method includes generating, by a first runtime circuitry, one or more algorithms based on the determined type of computing device. The example method includes executing, by a second runtime circuitry, the one or more algorithms on one or more corresponding computing devices to produce an output. The example method further includes packaging, by the formulation circuitry, the output for transmission via the interaction modality.

20 Claims, 9 Drawing Sheets

(51) Int. Cl.
 *G06N 3/04* (2023.01)
 *G06N 5/01* (2023.01)
 *H03K 19/195* (2006.01)

(56) References Cited

U.S. PATENT DOCUMENTS

| | | | |
|---|---|---|---|
| 2019/0266508 A1* | 8/2019 | Bunyk | G06N 10/00 |
| 2020/0050958 A1* | 2/2020 | Bloom | H03K 19/195 |
| 2020/0342347 A1* | 10/2020 | Gambetta | G06N 10/00 |
| 2021/0133438 A1* | 5/2021 | Florencio | G06F 3/0484 |
| 2021/0241143 A1* | 8/2021 | Amin | G06N 5/01 |
| 2022/0188885 A1* | 6/2022 | Blackman | G06F 16/182 |

* cited by examiner

SYSTEMS AND METHODS FOR LOW-CODE UTILIZATION OF A COMPUTING SYSTEM

CROSS-REFERENCE TO RELATED APPLICATIONS

This application claims the benefit of U.S. Provisional Patent Application No. 63/201,453, filed Apr. 30, 2021, the entire contents of which are incorporated herein by reference.

TECHNOLOGICAL FIELD

Example embodiments of the present disclosure relate generally to low-code utilization of a computing system and, more particularly, to systems and methods for low-code utilization of a computing system, the computing system determining an intermediate output, via a machine learning model, based on an input, the intermediate output indicating a type of computing device to generate an output, the type of computing device including quantum computing devices, classical computing devices, and hybrid computing devices.

BACKGROUND

Quantum computing may describe the use of quantum phenomena to perform computations or calculations. Classical computing may describe the use of a typical computing device (e.g., binary computing devices) to perform computations or calculations. Quantum computers may perform certain computations or calculations for models, equations, statistical analysis, etc. more quickly than is possible by a classical computing device.

BRIEF SUMMARY

However, coding techniques utilized for quantum computers are different than those used to run classical computing devices. Further, harnessing the capabilities of a quantum computer requires use of quantum algorithms, which may be difficult and time consuming to create. Thus, new users unfamiliar with relevant quantum algorithms may not be able to optimally utilize the faster processing offered by a quantum computer.

Accordingly, Applicant has recognized a need for systems and methods for optimizing the use of quantum computers, which are a scarce resource. Moreover, Applicant has recognized a need for reducing the barriers-to-entry for use of quantum computing. To this end, Applicant has developed the inventions described herein that utilize low coding techniques to allow many users the ability to utilize a quantum computing device. Further, example systems and methods described herein may steer users away from using quantum computers for tasks that can be performed suitably on classical computers. To this end, example systems may determine the type of computing device to utilize based on data input from a user and an intermediate output from a trained machine learning model. Once the type of computing device is determined (e.g., via the intermediate output), such example systems may generate algorithms based on the users input. These algorithms may be executed on corresponding classical or quantum computing devices to provide an output or outputs. The resulting output or outputs from the execution of the algorithms may be packaged for use (e.g., download or viewing) by the user or for transmission by an interaction modality.

Systems, apparatuses, methods, and computer program products are disclosed herein for receiving one or more different types of inputs from a user via an interaction modality. Such systems and methods may, based on the inputs and an intermediate output from a machine learning model, determine a type of computing device to be utilized for generating an output, such as an analysis, prediction, a model, or the like. For example, a task or computation that a user is seeking to perform may be described using a high level abstraction or free text and the system may determine which type of computing device to utilize for the task or computation, generate appropriate algorithms based on the high level abstraction or free text, execute the algorithms on the corresponding computing device(s), and package the resulting output for download via a user interface or the interaction modality.

In one example embodiment, a method is provided for low-code utilization of a computing system involving a classical computing device and a quantum computing device. The method may include receiving, by formulation circuitry, an input from an interaction modality. The method may include transmitting, by the formulation circuitry, the input to a machine learning model to produce an intermediate output. The method may include determining, by the formulation circuitry, a type of computing device needed for based on the intermediate output. The method may include generating, by a first runtime circuitry, one or more algorithms based on the determined type of computing device. The method may include executing, by a second runtime circuitry, the one or more algorithms on one or more corresponding computing devices to produce an output. The method may include packaging, by the formulation circuitry, the output for transmission via the interaction modality.

In other embodiments, the type of computing device may identify one of a hybrid computing device, a quantum computing device, and a classical computing device. The hybrid computing device may include a quantum computing device and a classical computing device. In an instance in which the type of computing device identifies the quantum computing device and the classical computing device, the generated one or more algorithms may include a quantum algorithm and a classical computing algorithm. The method may further include executing, by the second runtime circuitry, the quantum algorithm on a quantum circuitry to produce an initial output. The method may further include executing, by the second runtime circuitry, the classical computing algorithm with the initial output on the classical computing device to produce the output.

In other embodiments, the interaction modality may include one or more user interfaces. The one or more user interfaces may be configured to allow an input of a low coding text file, a drag and drop coding solution, or a free form text file.

In other embodiments, the method may include parsing the input into one or more values corresponding to key value pairs. In such embodiments, transmitting the input to the machine learning model may comprise transmitting, to the machine learning model, the one or more values corresponding to key value pairs. The method may include evaluating, by the formulation circuitry, the output to using machine learning model. The method may further include re-training, by the formulation circuitry, the machine learning model based on the output and an evaluation of the output.

In another example embodiment, an apparatus is provided for low-code utilization of a computing system involving a classical computing device and a quantum computing device. The apparatus may include input-output circuitry configured to generate one or more interaction modalities. The input-output circuitry may be configured to display one or more interaction modalities to a user interface. The input-output circuitry may be configured to receive an input via the one or more interaction modalities. The input-output circuitry may be configured to display an output to the user interface. The apparatus may include formulation circuitry configured to parse the input. The formulation circuitry may be configured to transmit the input to a machine learning model to produce an intermediate output. The intermediate output may indicate a type of computing device to generate an output. The formulation circuitry may be configured to transmit the intermediate output and input to a first runtime circuitry. The formulation circuitry may be configured to package the output from a second runtime circuitry. The formulation circuitry may further be configured to transmit the packaged output to the input-output circuitry. The apparatus may include a first runtime circuitry configured to generate one or more algorithms based on the input and intermediate output. The first runtime circuitry may be configured to transmit the one or more algorithms to the second runtime circuitry. The apparatus may include the second runtime circuitry configured to execute the one or more algorithms on the type of computing device, indicated by the intermediate output, to produce the output. The second runtime circuitry may further be configured to transmit the output to the formulation circuitry.

In other embodiments, in an instance in which the type of computing device identifies a quantum computing device and a classical computing device, the generated algorithm may include a quantum algorithm to be executed on a quantum circuitry and a classical computing algorithm to be executed on the classical computing device. The second runtime circuitry may further be configured to execute the quantum algorithm to produce an initial output produced by the execution of the quantum algorithm is further processed. The second runtime circuitry may further be configured to execute by the classical computing algorithm using the initial output to produce the output.

In an embodiment, the formulation circuitry may be configured to transmit any output, e.g., an output produced by the execution of the quantum algorithm or the classical computing algorithm, to the machine learning model for further training or re-training. In a further embodiment, formulation circuitry may transmit the output to the machine learning model, along with the input associated with the output, for further training or re-training.

In other embodiments, the quantum computing device may include quantum computing simulator or a physical quantum computing device. In yet other embodiments, the machine learning model includes a random forest model.

In another example embodiment, a computer program product for low-code utilization of a computing system involving a classical computing device and a quantum computing device. The computer program product may comprise at least one non-transitory computer-readable storage medium storing software instructions that, when executed, cause an apparatus to receive one of one or more types of inputs from a user interface. The executed software instructions may cause the apparatus to parse the input. The executed software instructions may cause the apparatus to determine an intermediate output based on the parsed input, wherein the intermediate output indicates a type of computing device to produce an output. The executed software instructions may cause the apparatus to generate one or more algorithms corresponding to the type of computing device based on the intermediate output. The executed software instructions may cause the apparatus to execute the one or more algorithms on the type of computing device to produce the output. The executed software instructions may cause the apparatus to package the output based on the parsed input. The executed software instructions may cause the apparatus to transmit the packaged output to the user interface.

In another embodiment, the executed software instructions may cause the apparatus to generate a drag and drop user interface to allow a user to enter the input. In other embodiments, the user interface may include one or more interactive modalities to allow a user to enter the input. The input may include one of an .INI file, a shell script, and text file. The input may include a type of algorithm, a problem type, a device type, a number of qubits, an output format, and a file name.

The foregoing brief summary is provided merely for purposes of summarizing example embodiments illustrating some aspects of the present disclosure. Accordingly, it will be appreciated that the above-described embodiments are merely examples and should not be construed to narrow the scope of the present disclosure in any way. It will be appreciated that the scope of the present disclosure encompasses many potential embodiments in addition to those summarized above, some of which will be described in further detail below.

BRIEF DESCRIPTION OF THE FIGURES

Having described certain example embodiments of the present disclosure in general terms above, reference will now be made to the accompanying drawings, which are not necessarily drawn to scale. Some embodiments may include fewer or more components than those shown in the figures.

DETAILED DESCRIPTION

Figure 1:
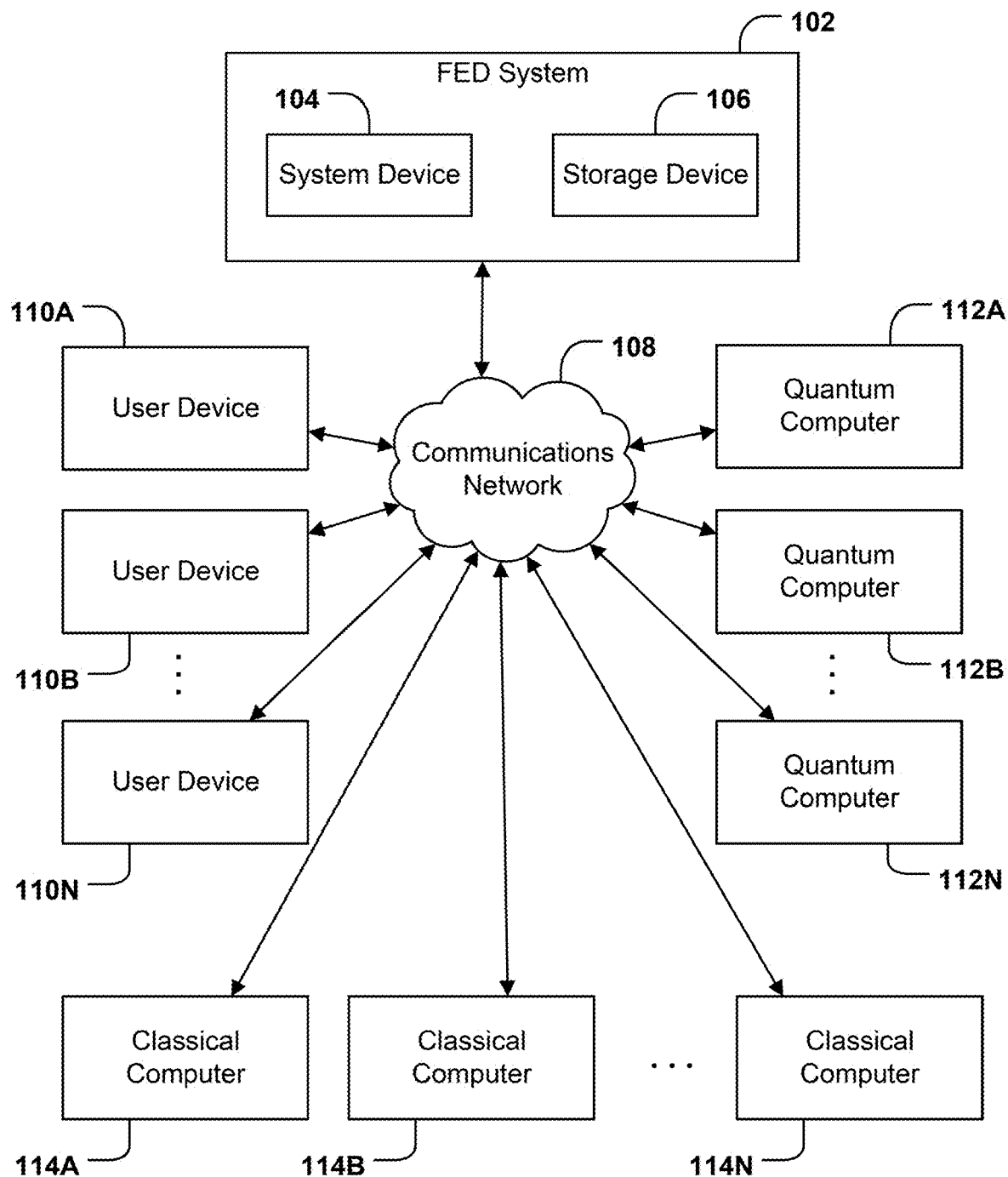
FIG. 1 illustrates a system in which some example embodiments may be used to determine a type of computing device to generate an output based on input from a user interface.

Some embodiments of the present disclosure will now be described more fully hereinafter with reference to the accompanying figures, in which some, but not all, embodiments of the disclosures are shown. Indeed, these disclosures may be embodied in many different forms and should not be construed as limited to the embodiments set forth herein; rather, these embodiments are provided so that this disclosure will satisfy applicable legal requirements.

The term "computing device" or "computing device" is used herein to refer to any one or all of programmable logic controllers (PLCs), programmable automation controllers (PACs), industrial computers, desktop computers, personal data assistants (PDAs), laptop computers, tablet computers, smart books, palm-top computers, personal computers, smartphones, wearable devices (such as headsets, smartwatches, or the like), and similar electronic devices equipped with at least a processor and any other physical components necessarily to perform the various operations described herein. Devices such as smartphones, laptop computers, tablet computers, and wearable devices are generally collectively referred to as mobile devices.

The term "server" or "server device" is used to refer to any computing device capable of functioning as a server, such as a master exchange server, web server, mail server, document server, or any other type of server. A server may be a dedicated computing device or a server module (e.g., an application) hosted by a computing device that causes the computing device to operate as a server. A server module (e.g., server application) may be a full function server module, or a light or secondary server module (e.g., light or secondary server application) that is configured to provide synchronization services among the dynamic databases on computing devices. A light server or secondary server may be a slimmed-down version of server type functionality that can be implemented on a computing device, such as a smart phone, thereby enabling it to function as an Internet server (e.g., an enterprise e-mail server) only to the extent necessary to provide the functionality described herein.

The term "non-transitory machine-readable storage medium" is used to refer to any electronic, magnetic, optical, or other physical storage apparatus to contain or store information such as executable instructions, data, and the like. For example, any machine-readable storage medium described herein may be any of random access memory (RAM), volatile memory, non-volatile memory, flash memory, a storage drive (e.g., hard drive), a solid state drive, any type of storage disc, and the like, or a combination thereof. The memory may store or include instructions executable by the processor.

The term "processor" or "processing circuitry" is used to refer to any one processor or multiple processors included in a single device or distributed across multiple computing devices. The processor may be at least one of a central processing unit (CPU), a semiconductor-based microprocessor, a graphics processing unit (GPU), a field-programmable gate array (FPGA) to retrieve and execute instructions, a real time processor (RTP), other electronic circuitry suitable for the retrieval and execution instructions stored on a machine-readable storage medium, or a combination thereof.

The term "classical computing", "classical computer", "classical computing device", or "classical computing system" is used to refer to a binary computing device or device. A classical computer may execute functions or operations in a deterministic and logical way.

The term "quantum computing", "quantum computer", "quantum computing device", or "quantum computing system" is used to refer to a computing device or device utilizing quantum bits (which may also be referred to as qubits).

The term "quantum bit" or "qubit" refers to a basic unit of quantum information comprising a two-state, or two-level, quantum mechanical system, such as: the polarization of a single photon (e.g., a photon encoded using a quantum basis as previously defined); the spin of a single electron (e.g., a spin qubit comprising the spin up state $|1\rangle$ and the spin down state $|0\rangle$); the energy level of a single atom (e.g., a superconducting qubit); or any other suitable qubit. A quantum bit may exhibit quantum superposition of its two states, unlike a classical bit, which is either a 0 or a 1. The superposition of a qubit's states is a feature of quantum mechanics, and enable certain calculations to be performed probabilistically in parallel and at a faster rate by a quantum computer than is possible by a classical computer.

Overview

As noted above, methods, apparatuses, systems, and computer program products are described herein that provide for generating an output from a determined type of computing device, e.g., quantum computing devices, classical computing devices, or a hybrid computing device. Traditionally, to solve a computational or statistical problem, an algorithm is written to be utilized on a corresponding computing device. While until recently all computing devices have been classical computing devices, the recent emergence of quantum computing means that computing devices may now comprise either classical computing devices or, in some cases, quantum computing devices. However, quantum computing devices are not widely available and using them can be very expensive. Moreover, quantum algorithms that harness the additional computational power of quantum computing devices are generally unknown to most of the population, even for experienced software developers who have only ever worked with classical computers. In addition, creating quantum algorithms may require creating or configuring corresponding quantum circuits, which also requires experience and training.

To address these issues and others, the present disclosure describes solutions for determining an intermediate output to indicate a type of computing device (e.g., classical, quantum, or a hybrid thereof) for a computational or statistical problem based on a low-coding, drag and drop, and/or free text input; generating one or more corresponding algorithm for the determined or indicated type of computing device; and generating an output utilizing the determined type of computing device and generated corresponding algorithm(s) based on the computational or statistical problem (e.g., from the input). Such systems, methods, and apparatuses may include one or more interactive modalities or a user interface configured to receive an input from a user. The input may be entered in one or more different ways, e.g., free text, drag and drop (via a drag and drop user interface), or text file (e.g., .INI file, shell script, and/or other type of text file). The input may be transmitted or parsed and portions of the input may be transmitted to a trained machine learning model. The trained machine learning model may determine, based on the input or portion of the input, an intermediate output. The intermediate output may indicate a type of computing device (e.g., a quantum computing device, a classical computing device, or a hybrid computing device) to be utilized for the computational or statistical problem and/or may indicate the type of algorithms to be generated. Once the type of computing device has been determined, one or more algorithms may be generated based on the determined type of computing device and/or the input. Once the one or more algorithms are generated, the one or more algorithms may be executed on the determined type of computing device(s) to produce an output. The resulting output of the computing device(s) may then be packaged and transmitted to the trained machine learning model, along with an evaluation and/or for further fine-tuning or re-training, and/or to the interactive modalities or user interface (e.g., for viewing or for download by a user).

Accordingly, the present disclosure sets forth systems, methods, and apparatuses that generate an output, based on execution of an automatically generated one or more algorithms, from one or more determined type of computing device indicated by an intermediate output from a machine learning model. There are many advantages of these and other embodiments described herein. For instance, such systems, methods, and apparatuses may enable identification of the proper, suitable, or efficient types of computing devices to use to for a given project. While quantum computing may be computationally faster for some applications, this is not always the case and classical computing is generally a far cheaper and more ubiquitous resource. Further, some use cases benefit from a combination of the two. The systems, methods, and apparatuses allow for automatic and quick identification of which computing devices to utilize for a particular problem without requiring software developers to possess a deep knowledge of quantum computing. In addition, the systems, methods, and apparatuses allow for automatic generation of algorithms for such computing devices with low effort through use of low-coding techniques. Creating relevant quantum algorithms may be difficult without significant domain knowledge, so systems, methods, and apparatuses described herein may include a user interface or interaction modalities to allow a user to enter in a number of inputs and, with little to no experience in coding or algorithm generation, automatically create and execute code on classical and/or quantum computing devices in order to produce and deliver a desired output.

Although a high level explanation of the operations of example embodiments has been provided above, specific details regarding the configuration of such example embodiments are provided below.

System Architecture

Example embodiments described herein may be implemented using any of a variety of computing devices or servers. To this end, FIG. 1 illustrates an example environment within which embodiments of the present disclosure may operate. As illustrated, a functional express directive (FED) system 102 may include a system device 104 in communication with a storage device 106. Although system device 104 and storage device 106 are described in singular form, some embodiments may utilize more than one system device 104 and/or more than one storage device 106. Additionally, some embodiments of the FED system 102 may not require a storage device 106 at all. Whatever the implementation, the FED system 102, and its constituent system device(s) 104 and/or storage device(s) 106 may receive and/or transmit information via communications network 108 (e.g., the Internet) with any number of other devices, such as one or more of user device 110A, user device 110B, through user device 110N, quantum computer 112A, quantum computer 112B, through quantum computer 112N, and/or classical computer 114A, classical computer 114B, through classical computer 114N.

System device 104 may be implemented as one or more servers, which may or may not be physically proximate to other components of the FED system 102. Furthermore, some components of system device 104 may be physically proximate to the other components of the FED system 102 while other components are not. System device 104 may receive, process, generate, and transmit data, signals, and electronic information to facilitate the operations of the FED system 102. Particular components of system device 104 are described in greater detail below with reference to apparatus 200 in connection with FIG. 2.

Storage device 106 may comprise a distinct component from system device 104, or may comprise an element of system device 104 (e.g., memory 204, as described below in connection with FIG. 2). Storage device 106 may be embodied as one or more direct-attached storage (DAS) devices (such as hard drives, solid-state drives, optical disc drives, or the like) or may alternatively comprise one or more Network Attached Storage (NAS) devices independently connected to a communications network (e.g., communications network 108). Storage device 106 may host the software executed to operate the FED system 102. Storage device 106 may store information relied upon during operation of the FED system 102, such as various machine learning models and data input via one or more of the user devices 110A-110N that may be used by the FED system 102, data and documents to be analyzed using the FED system 102, or the like. In addition, storage device 106 may store control signals, device characteristics, and access credentials enabling interaction between the FED system 102 and one or more of the user devices 110A-110N, quantum computers 112A-112N, or classical computers 114A-114N.

The one or more user devices 110A-110N may comprise a device to display a user interface, such as a display, and may further comprise the components that govern use of the user interface, such as a web browser, mobile application, dedicated client device, or the like. In some embodiments, the one or more user devices 110A-110N may include a keyboard, a mouse, a touch screen, touch areas, soft keys, a microphone, a speaker, and/or other input/output mechanisms. In such examples, the FED system 102 may generate the user interface to be displayed on the one or more user devices 110A-110N.

The one or more quantum computers 112A-112N may be embodied by any quantum computing devices, devices, and/or simulators known in the art. For example, each of the one or more quantum computers 112A-112N may be different types of quantum computing device (e.g., a quantum annealer, adiabatic quantum computer, analog quantum computer, universal quantum computer, or other quantum computing device known in the art) and/or quantum computing devices from different vendors or providers. The one or more classical computers 114A-114N may be embodied by any classical computing devices, devices, simulators, and/or virtual devices known in the art, such as desktop or laptop computers, servers, virtual machines, or the like. The one or more user devices 110A-110N, the one or more quantum computers 112A-112N, and the one or more classical computer 114A-114N need not themselves be independent devices, but may be peripheral devices communicatively coupled to other computing devices.

Although FIG. 1 illustrates an environment and implementation of the present disclosure in which the FED system 102 interacts with one or more of user devices 110A-110N, in some embodiments users may directly interact with the FED system 102 (e.g., via input/output circuitry of system device 104), in which case a separate user device may not be utilized. Whether by way of direct interaction or via a separate user device, a user may communicate with, operate, control, modify, or otherwise interact with the FED system 102 to perform functions described herein and/or achieve benefits as set forth in connection with this disclosure.

Example Implementing Apparatuses

Figure 2:
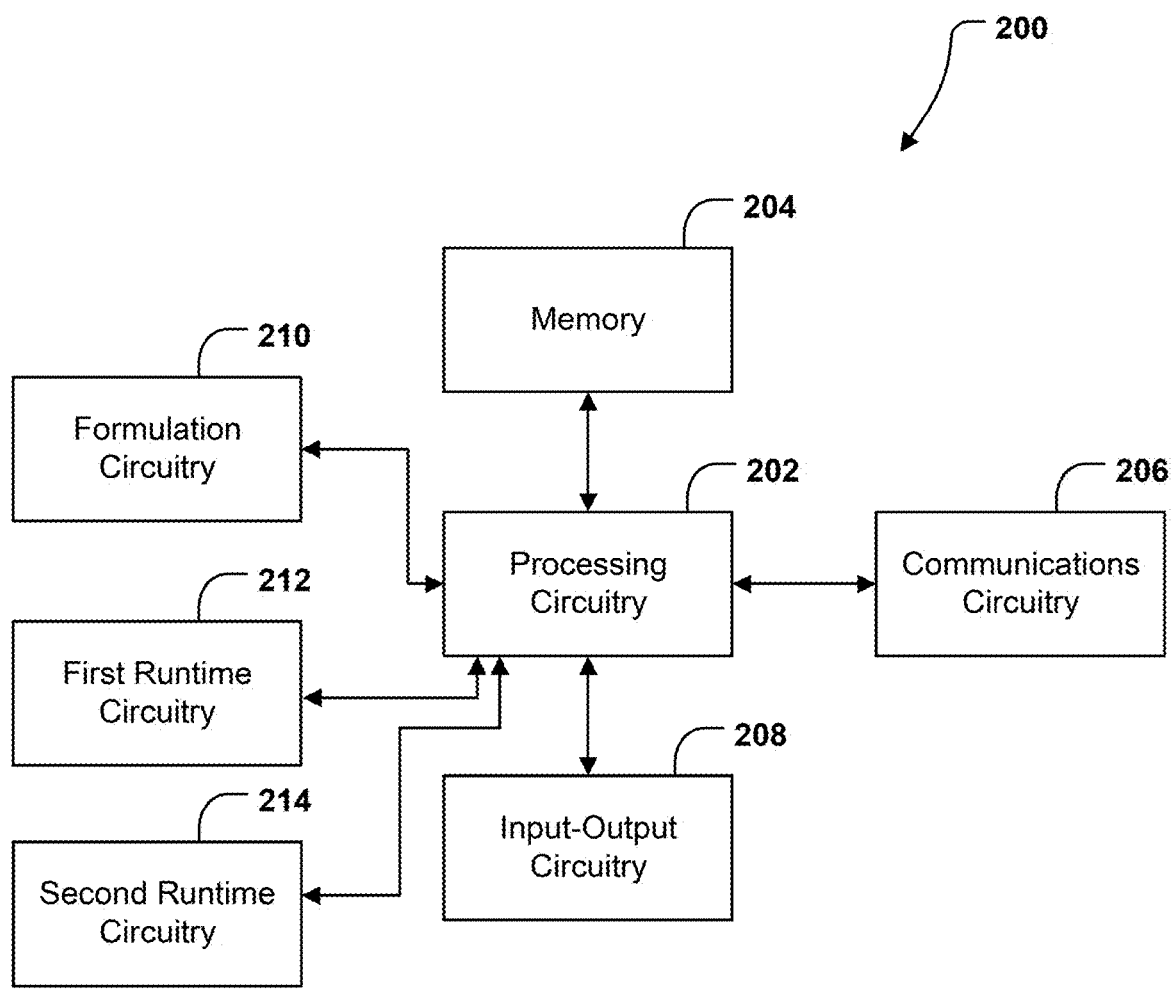
FIG. 2 illustrates a schematic block diagram of example circuitry embodying a device that may perform formulation, runtime, and execution operations in accordance with some example embodiments described herein.

System device 104 of the FED system 102 (described previously with reference to FIG. 1) may be embodied by one or more computing devices or servers, shown as apparatus 200 in FIG. 2. As illustrated in FIG. 2, the apparatus 200 may include processing circuitry 202 (e.g., one or more processors), memory 204, communications circuitry 206, input-output circuitry 208, formulation circuitry 210, first runtime circuitry 212, and/or second runtime circuitry 214, each of which will be described in greater detail below. While the various components are only illustrated in FIG. 2 as being connected with processing circuitry 202, it will be understood that the apparatus 200 may further comprises a bus (not expressly shown in FIG. 2) for passing information amongst any combination of the various components of the apparatus 200. The apparatus 200 may be configured to execute various operations described above in connection with FIG. 1 and below in connection with FIGS. 3A-3C.

The processing circuitry 202 (and/or co-processor or any other processor assisting or otherwise associated with the processor) may be in communication with the memory 204 via a bus for passing information amongst components of the apparatus 200. The processing circuitry 202 may be embodied in a number of different ways and may, for example, include one or more processing devices configured to perform independently. Furthermore, the processing circuitry 202 may include one or more processors configured in tandem via a bus to enable independent execution of software instructions, pipelining, and/or multithreading. The use of the term "processor", as noted above, may be understood to include a single core processor, a multi-core processor, multiple processors of the apparatus 200, remote or "cloud" processors, or any combination thereof.

The processing circuitry 202 may be configured to execute software instructions stored in the memory 204 or otherwise accessible to the processing circuitry 202 (e.g., software instructions stored on a separate storage device 106, as illustrated in FIG. 1). In some cases, the processing circuitry 202 may be configured to execute hard-coded functionality. As such, whether configured by hardware or software methods, or by a combination of hardware with software, the processing circuitry 202 represents an entity (e.g., physically embodied in circuitry) capable of performing operations according to various embodiments of the present invention while configured accordingly. Alternatively, as another example, when the processing circuitry 202 is embodied as an executor of software instructions, the software instructions may specifically configure the processing circuitry 202 to perform the algorithms and/or operations described herein when the software instructions are executed.

Memory 204 is non-transitory and may include, for example, one or more volatile and/or non-volatile memories. In other words, for example, the memory 204 may be an electronic storage device (e.g., a computer readable storage medium). The memory 204 may be configured to store information, data, content, applications, software instructions, or the like, for enabling the apparatus to carry out various functions in accordance with example embodiments contemplated herein.

The communications circuitry 206 may be any means such as a device or circuitry embodied in either hardware or a combination of hardware and software that is configured to receive and/or transmit data from/to a network and/or any other device, circuitry, or module in communication with the apparatus 200. In this regard, the communications circuitry 206 may include, for example, a network interface for enabling communications with a wired or wireless communication network. For example, the communications circuitry 206 may include one or more network interface cards, antennas, buses, switches, routers, modems, and supporting hardware and/or software, or any other device suitable for enabling communications via a network. Furthermore, the communications circuitry 206 may include the processing circuitry for causing transmission of such signals to a network or for handling receipt of signals received from a network.

The apparatus 200 may include input-output circuitry 208 configured to provide output to a user and, in some embodiments, to receive an indication of user input. It will be noted that some embodiments will not include input-output circuitry 208, in which case user input may be received via a separate device such as a user device (e.g., one of user devices 110A-110N, as shown in FIG. 1). The input-output circuitry 208 may comprise a user interface, such as a display, and may further comprise the components that govern use of the user interface, such as a web browser, mobile application, dedicated client device, or the like. In some embodiments, the input-output circuitry 208 may include a keyboard, a mouse, a touch screen, touch areas, soft keys, a microphone, a speaker, and/or other input/output mechanisms. The input-output circuitry 208 may utilize the processing circuitry 202 to control one or more functions of one or more of these user interface elements through software instructions (e.g., application software and/or system software, such as firmware) stored on a memory (e.g., memory 204) accessible to the processing circuitry 202.

As noted the input-output circuitry 208 may comprise a user interface. The input-output circuitry 208 may generate a user interface. The user interface may include one or more interaction modalities, modules, or interfaces allowing for a user to input information in one or more formats. For example, the input-output circuitry 208 may include or comprise a file upload interface. In such examples the file upload interface may comprise a selectable button. In response to a selection of the selectable button, a user may be directed or prompted to select a file location and/or drag a particular file (e.g., an .INI file, a shell script, a text file, or the like) to a box. The data included in the file may then be parsed or partitioned into sections, prior to transmission to other circuitry. In another example, the input-output circuitry 208 may include a drag and drop user interface. The drag and drop interface may include several options for the user to select and drag to a particular area to define a problem and/or project. For example, the user may be able to drag different boxes or symbols indicating different aspects of a problem and/or project (e.g., type of device, different aspects of the type of device, output format, type of algorithm, problem type, and/or other aspects as described in other embodiments or examples herein) to an area of the drag and drop user interface. In such an example, the user may also add a file or link including data related to the problem and/or project. In another embodiment, the input-output circuitry 208 may include a free form text entry user interface. In such examples, a user may enter text free form, e.g., as sentences, variables, a paragraph, a problem statement, and/or via a form with dropdowns or free text boxes. In any of the examples described, the input-output circuitry 208 may parse input into relevant or related sections. If a user enters information or data incorrectly the input-output circuitry 208 may display an error and/or prompt a user to enter or re-enter information or data correctly.

In another embodiment, the input-output circuitry 208 may be a predictive user interface or include a predictive algorithm. The predictive user interface or predictive algorithm may pre-fill and/or list data or inputs based on a user selection, user input, and/or partial user input. For example, for a free form text entry user interface, as a user enters selections or data, the predictive user interface or predictive algorithm may predict the rest of the selection or data the user is attempting to enter. The predictive user interface or predictive algorithm may autofill other fields based on a first field filled, for example, if a user inputs a particular quantum algorithm, then the rest of text entry boxes may be automatically filled along with relevant key-value pairs. Such a predictive user interface or predictive algorithm may be included or integrated with the other types of user interfaces described herein, such as the drag and drop interface.

In addition, the apparatus 200 further comprises a formulation circuitry 210 that may parse and/or partition data. After the data has been parsed and/or partitioned, the formulation circuitry 210 may further store parsed and/or partitioned data with different identifiers, labels, or in a specific order indicating what the data may relate to. For instance, a type of model input may be labeled or identified as model data, while a file containing data regarding the problem may be labeled or identified as an input. In another example, the formulation circuitry 210 may include a FED automation pipeline. The FED automation pipeline may receive a portion of or all of the parsed and/or partitioned data. The FED automation pipeline may include a machine learning module, as will be described below. The FED automation pipeline may receive the data and prepare or pre-process the data. Such preparation and/or pre-processing operation may allow for the relevant data to remain in the overall set of data, while removing other portions of the data not relevant to determining a type of computing device to utilize. In another example, such preparation and/or pre-processing may include altering or changing the input to match a specified input for the machine learning model or classifier.

The machine learning model or classifier may be trained, by the formulation circuitry 210 or by another computing device, via one or more types of machine learning algorithms, such as linear regression, logistic regression, decision tree, Naive Bayes, neural networks, kNN, k-means, random forests, other types of machine learning algorithms, or some combination thereof. Training data may include a plurality of prior inputs entered by a user, associated and identified types of computing devices, and/or other information regarding the use of a particular type of computing device in relation to each of the plurality of prior inputs. The machine learning model or classifier may receive the prepared and/or pre-processed data and, based on prior training, output a number, value, or intermediate output. The number, value, or intermediate output may be transmitted to a FED task chain to determine a type of computing device to be utilized to determine a solution to the problem (e.g., classical computing device, quantum computing device, or a hybrid computing device). Such an intermediate output may be based on one or more factors determined via the trained machine learning model or classifier. In other words, the trained machine learning model may take into account factors relating to a request or problem and determine the best type or combination of types of computing devices to apply to the request. Such factors may include the length of potential processing time via each of the one or more types of computing devices, potential errors or error rate of a model or output produced by the one or more types of computing devices, general availability of one or more types of computing devices, and/or other factors related to the request and/or one or more computing devices. Once the machine learning model or classifier provides an intermediate output, the resulting intermediate output may be transmitted from the FED automation pipeline to task initialization of the formulation circuitry 210. The intermediate output may indicate a type of computing device to be utilized for a particular computational or statistical problem. Task initialization may include identifying specified and/or indicated available computing devices (e.g., classical computing devices or quantum computing devices), connecting to the available identified computing devices, and transferring data to the first runtime circuitry 212 and/or the second runtime circuitry 214. The formulation circuitry 210 may utilize processing circuitry 202, memory 204, or any other hardware component included in the apparatus 200 to perform these operations, as described in connection with FIGS. 3A through 6 below. The formulation circuitry 210 may further utilize communications circuitry 206 to gather data from one or more sources (e.g., user device 110A through user device 110N or storage device 106, as shown in FIG. 1), may utilize input-output circuitry 208 to receive data from a user, and in some embodiments may utilize processing circuitry 202 and/or memory 204 to formulate and/or setup a FED task.

In addition, the apparatus 200 may further comprise or include first runtime circuitry 212 and/or second runtime circuitry 214. In an embodiment, the apparatus 200 may include one runtime circuitry including the functionality of the first runtime circuitry 212 and/or the second runtime circuitry 214. The first runtime circuitry 212 may generate algorithms for selected or specified computing devices and connect to the selected or specified computing devices and/or generate virtual environments to execute the generated algorithms. Once one or more algorithms are generated, the first runtime circuitry 212 may transmit the one or more algorithms to the second runtime circuitry 214. The output of the formulation circuitry 210 may include which type of computing devices to utilize (e.g., as indicated by the intermediate output or other value). Based on the type of computing devices to be utilized, the second runtime circuitry 214 may determine available computing devices of the appropriate kinds. Further, the second runtime circuitry 214 may then generate algorithms based on the input and based on the output of the FED automation pipeline. Such algorithm generation may be performed based on the data included in the input from the user or other device. In an example, the data input by the user or other device may be mappable to specific functions and/or parts of algorithms by a known rules set. For example, a portion of an input may include a key or be classified or defined as a key. The key may be associated with a set of values or algorithm. As the first runtime circuitry 212 determines the key selected or specified by a user or other device, the first runtime circuitry 212 may map the key to corresponding algorithms or portion of algorithms. Such operations may be performed for each key, thus creating an algorithm for a corresponding computing device. In another embodiment, the functionality of the first runtime circuitry 212 may be included in the second runtime circuitry 214, while the functionality of the second runtime circuitry 214 may be included in the first runtime circuitry 212. In another embodiment, the runtime circuitry generating the one or more algorithms may be included in or may be a classical computing device.

The second runtime circuitry 214 may connect, e.g., via communications circuitry 206, to the available and corresponding computing devices. The generated algorithm or algorithms may then be executed on the selected and corresponding computing devices. In another embodiment, the runtime circuitry executing the algorithm may be a classical computing device or a quantum computing device. In such embodiments, the runtime circuitry may include or may be a part of a classical computing device and/or quantum computing device. Once the algorithms have been executed, the output may be fed back through the second runtime circuitry 214 or may be transmitted to another computing device or to the formulation circuitry 210. The formulation circuitry 210 may package the output in, for example, a format specified by the initially received input, and may transmit the output to the input-output circuitry 208 for delivery to the user. The first runtime circuitry 212 and/or second runtime circuitry 214 may utilize processing circuitry 202, memory 204, or any other hardware component included in the apparatus 200 to perform these operations, as described in connection with FIGS. 3A-6 below. The runtime circuitry 212 and/or second runtime circuitry 214 may further utilize communications circuitry 206 to gather data from a variety of sources (e.g., quantum computer 112A through quantum computer 112N, classical computer 114A through classical computer 114N, or storage device 106, as shown in FIG. 1), may utilize input-output circuitry 208 to receive data from a user, and in some embodiments may utilize processing circuitry 202 and/or memory 204 to generate algorithms, determine available computing devices, and/or execute the algorithms on the corresponding and/or selected computing devices.

Although components 202-214 are described in part using functional language, it will be understood that the particular implementations necessarily include the use of particular hardware. It should also be understood that certain of these components 202-214 may include similar or common hardware. For example, the formulation circuitry 210, first runtime circuitry 212, and second runtime circuitry 214 may each at times leverage use of the processing circuitry 202, memory 204, communications circuitry 206, or input-output circuitry 208, such that duplicate hardware is not required to facilitate operation of these physical elements of the apparatus 200 (although dedicated hardware elements may be used for any of these components in some embodiments, such as those in which enhanced parallelism may be desired). Use of the terms "circuitry," and "engine" with respect to elements of the apparatus therefore shall be interpreted as necessarily including the particular hardware configured to perform the functions associated with the particular element being described. Of course, while the terms "circuitry" and "engine" should be understood broadly to include hardware, in some embodiments, the terms "circuitry" and "engine" may in addition refer to software instructions that configure the hardware components of the apparatus 200 to perform the various functions described herein.

Although the formulation circuitry 210, first runtime circuitry 212, and second runtime circuitry 214 may leverage processing circuitry 202, memory 204, communications circuitry 206, or input-output circuitry 208 as described above, it will be understood that any of these elements of apparatus 200 may include one or more dedicated processors, specially configured field programmable gate array (FPGA), or application specific interface circuit (ASIC) to perform its corresponding functions, and may accordingly leverage processing circuitry 202 executing software stored in a memory (e.g., memory 204), or memory 204, communications circuitry 206 or input-output circuitry 208 for enabling any functions not performed by special-purpose hardware elements. In all embodiments, however, it will be understood that the formulation circuitry 210, first runtime circuitry 212, and second runtime circuitry 214 are implemented via particular machinery designed for performing the functions described herein in connection with such elements of apparatus 200.

Figure 3A:
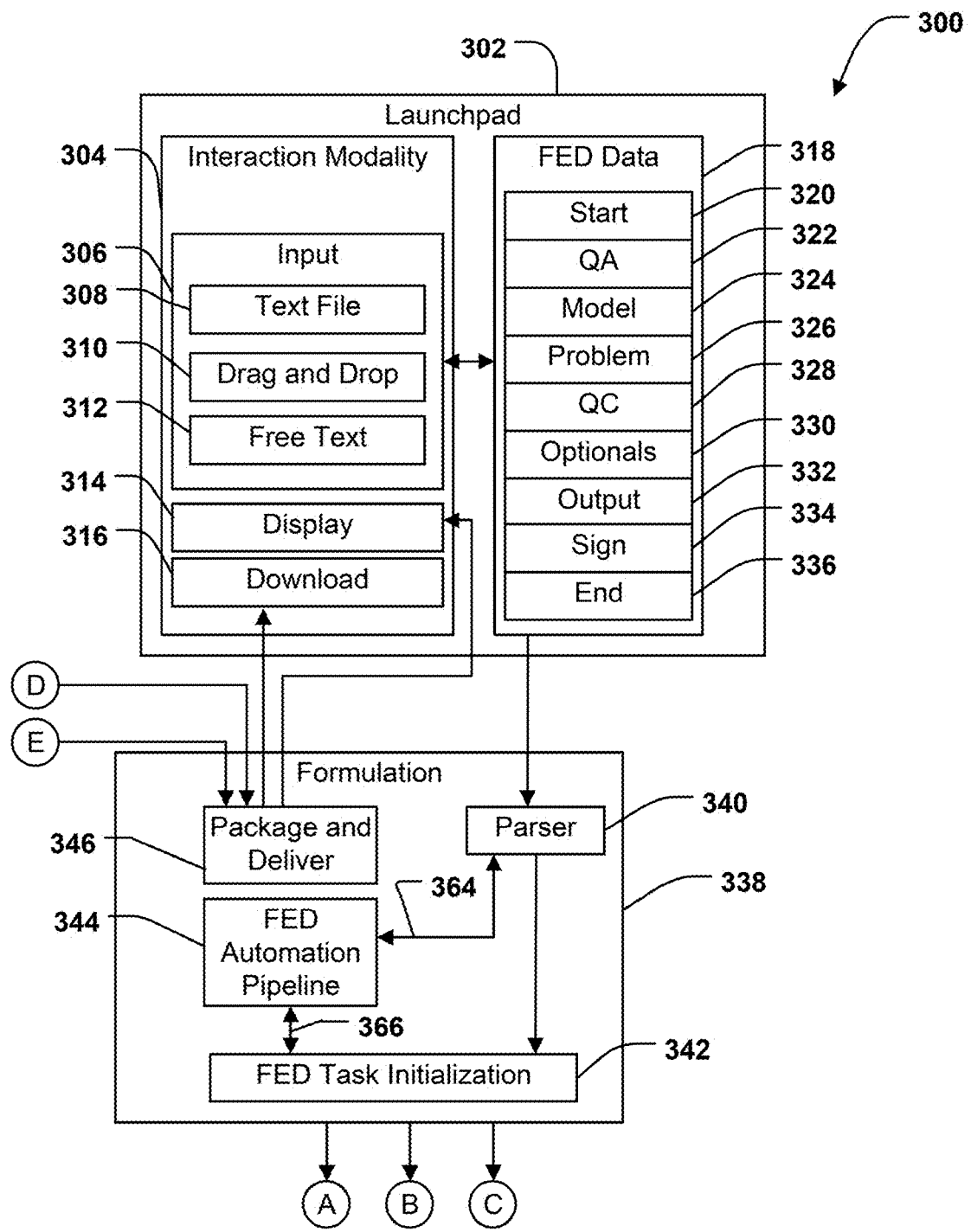
FIGS. 3A, FIG. 3B, and FIG. 3C illustrate another schematic block diagram of example circuitry embodying a device that may perform formulation, runtime, and execution operations in accordance with some example embodiments described herein.
Figure 3B:
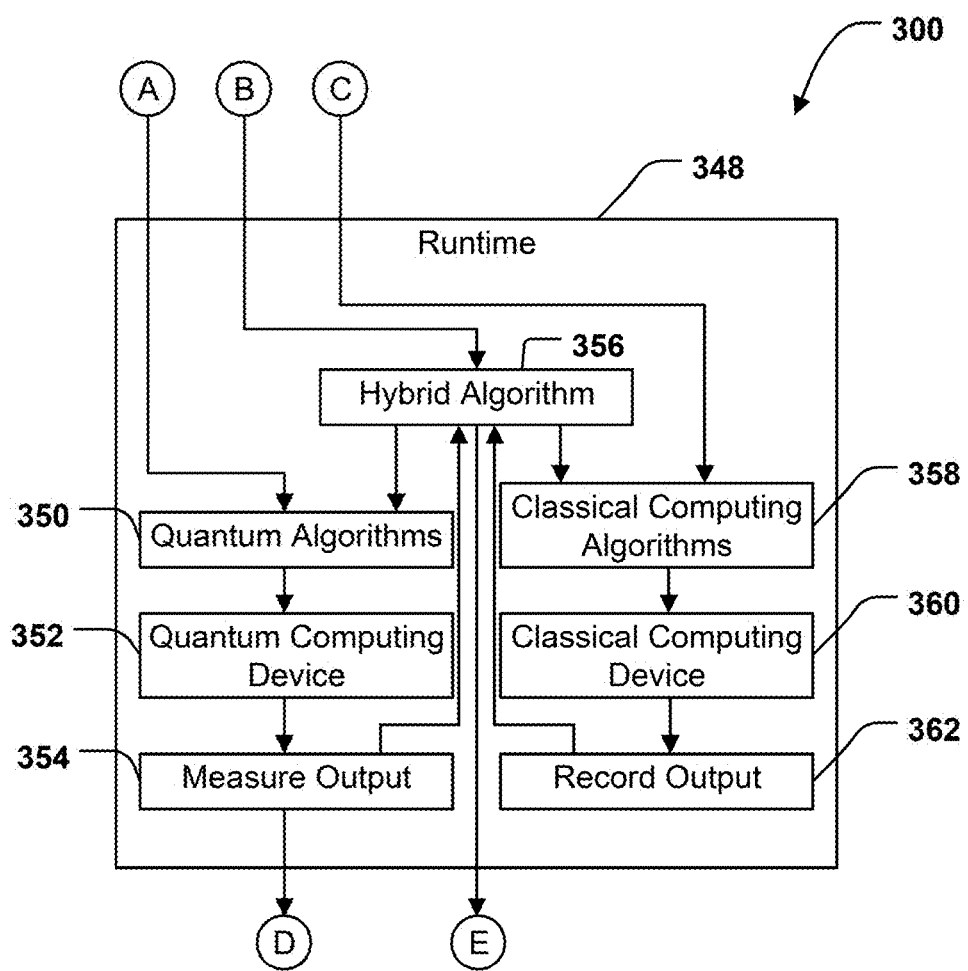
Figure 3C:
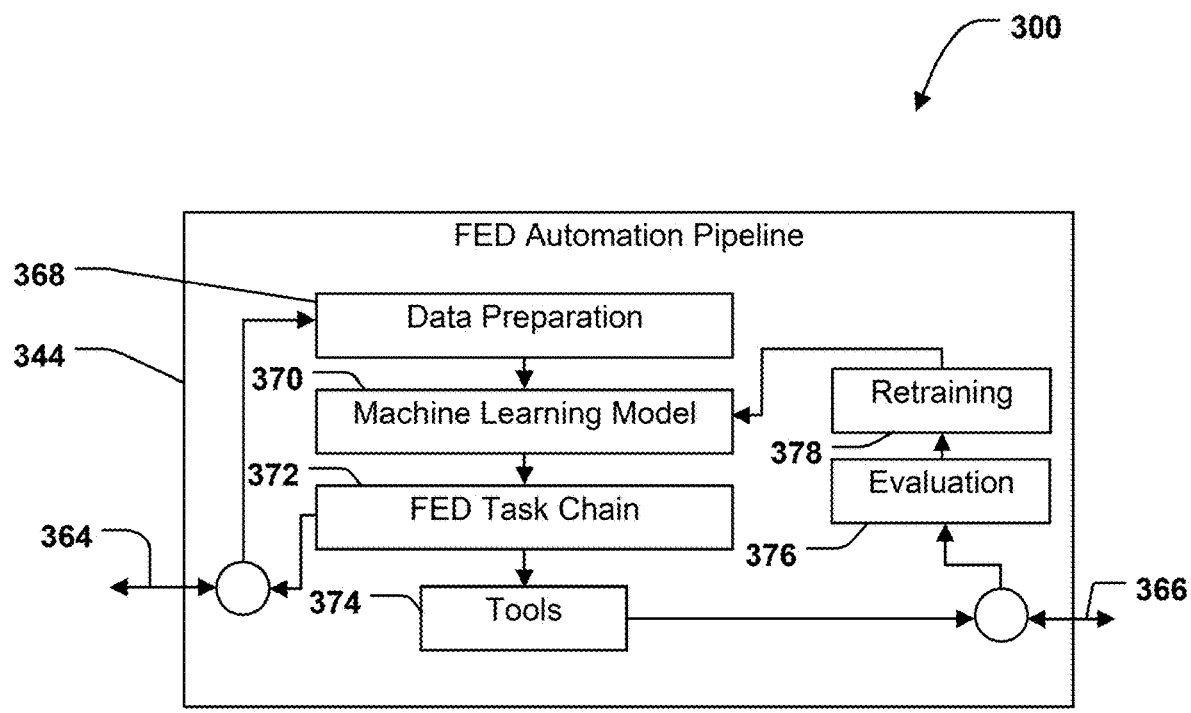

As illustrated in FIGS. 3A through 3C, an apparatus 300 is shown that may incorporate the various elements of apparatus 200 described previously. The apparatus 300 represents an example Launchpad 302 (e.g., an instance of an input-output circuitry 208), an example formulation circuitry 338 or engine (e.g., an instance of formulation circuitry 210), and/or an example runtime circuitry 348 (e.g., an instance of first runtime circuitry 212 and/or second runtime circuitry 214). The apparatus 300 may include various other components of an apparatus 200, such as processing circuitry 202, memory 204, input-output circuitry 208, and communications circuitry 206, and may optionally include a Launchpad 302, formulation circuitry 338, runtime circuitry 348, and FED automation pipeline 344, each of which is configured to be similar to the similarly named components described above in connection with FIG. 2. However, the apparatus 300 also includes features that are specific to the overall FED system, such as hardware components designed for FED automation, algorithm generation, computing device selection, and/or algorithm execution. The Launchpad 302, formulation circuitry 338, and/or runtime circuitry 348 may utilize processing circuitry 202, memory 204, or any other hardware component included in the apparatus 200 or 300 to perform these operations, as described in connection with FIGS. 5 and 6 below.

Figure 4A:
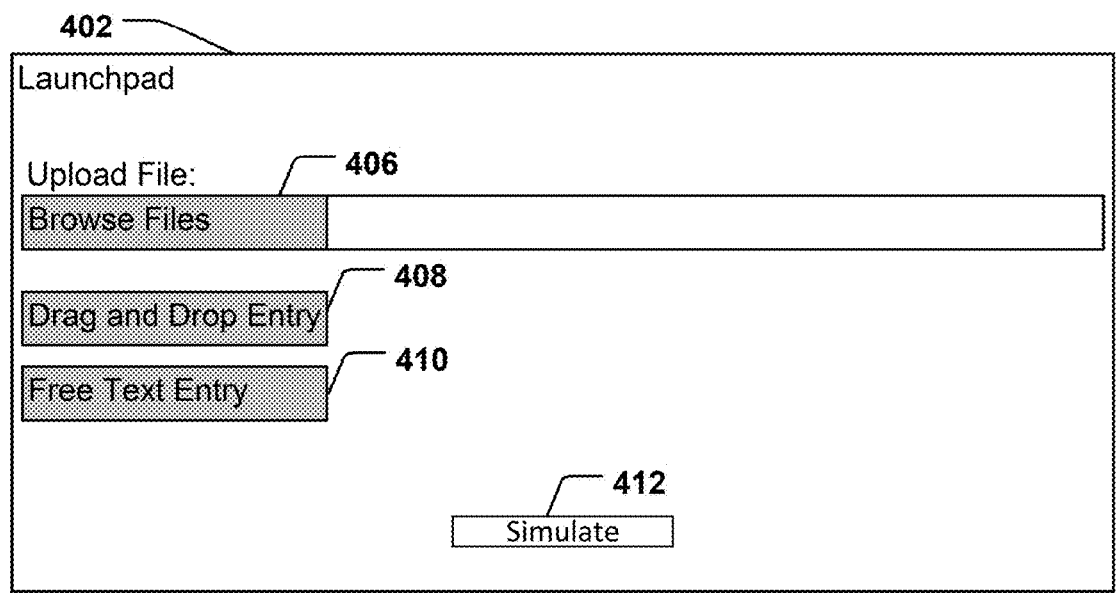
FIG. 4A and FIG. 4B illustrate example user interfaces used in some example embodiments described herein.

In FIG. 3A, a Launchpad 302 is illustrated. As noted, the Launchpad 302 may include one or more interaction modalities 304 to allow for a user to enter in or input data regarding a problem. The solution or prediction of such a problem may be obtainable through either quantum computing, classical computing, or hybrid computing (e.g., a combination of quantum computing with classical computing). The one or more interaction modalities 304 may include an input interface 306, such as a text file input 308, drag and drop input 310, free text input 312, and/or other types of input interfaces, such. Further, the input interface 306 may utilize a prediction module hosted by the Launchpad 302 to automatically populate various fields as a user enters in specific data via the input interface 306. For example, based on a particular input by a user, such as a quantum algorithm stored in the quantum algorithm (QA) section 322, the prediction module may automatically populate the remaining FED data instructions 318. The user may then adjust or alter the automatically populated FED data instructions 318 as desired. The Launchpad 302 may be configurable to present a GUI or display 314 to a user (e.g., via input-output circuitry 208). Similarly, the Launchpad 302 may enable a user to download at 316 or view a solution or final output (e.g., via display 314), as described in greater detail below. An example input interface is shown in FIG. 4A, which is discussed below.

The Launchpad 302 may receive input from the user and re-package that input as FED data instructions 318. The FED data instructions 318 may essentially comprise partitioned input or data from the user or a device that is re-cast into the categories or sections required for consumption by formulation circuitry 338. Such a partition or packet may include a starting point 320. The starting point 320 may be identified in the user input, or it may not be indicated by a user and instead may be populated by the Launchpad 302 based on a determination that certain user input or data is the beginning of a new string of input. The partition or packet may include a quantum algorithm (QA) section 322, which may store any user-specified quantum algorithms, such as a simulation algorithm, an optimization algorithm, a quantum machine learning (QML) algorithm, composite algorithm, or the like. In some embodiments, the QA section 322 may include classical algorithms as well. The data for QA section 322 may not be selected or filled in manually, but rather may be automatically populated via instructions in the Launchpad 302 or other circuitry based on the higher-level input received from the user. For instance, a user may enter a higher-order instruction, which may be converted into a quantum algorithm by the Launchpad 302 (potentially leveraging the formulation circuitry 338) via a rules set. A user may also enter in a model 324 and/or a sub-model. For example, a user may select a Monte-Carlo model and a Vasicek sub-model. While the example of a Monte-Carlo model is given, such an example should not be construed as the only example, as a user may specify any of a number of models. The user may also enter in a problem 326. The problem 326 may include data relating to a particular problem or point to a file location of a set of data related to the particular problem. The problem 326 may include a problem type and name. In other examples, rather than a computational or statistical problem or a particular problem, a user may input a general software solution. In such examples, the user may input a solution that the user seeks to execute or deploy on a particular type of computing device (e.g., quantum computing device, classical computing device, or hybrid computing device). The general software solution may be input as abstract or free text or as a section of software or code.

The user may enter in QC data 328, e.g., a particular quantum computing device, an amount of qubits, a type of device, and/or user account data to provide access to one or more quantum computing device. The user may enter in optional data 330 as well, e.g., such as a particular quantum computing vendor, a quantum noise model, quantum shots, quantum run, and/or quantum measurement. The user may then input a requested type of output and/or a location to which the output 332 should be delivered (e.g., where and how the user would like the output 332 produced). Types of outputs may include JSON, CSV, Excel, XML, HTML, and/or any other suitable file type. Finally, the user may enter in information regarding encryption or signing 334 of the input data and/or the output file. In such examples, the apparatus 300 may include public key infrastructure (PKI) to support signing and verification of the input and/or the output. In an example, when the input is signed, additional functionality may be available to the user providing the input, e.g., such as reservation of different available computing devices and/or higher quantum volume machines. The Launchpad 302 may add the end 336 signal or bits indicating the end of an input.

FIG. 3A also illustrates formulation circuitry 338. The formulation circuitry 338 may include a parser 340. The parser 340 may parse the data transmitted by the Launchpad 302. Portions or all of the parsed data may be transmitted to the FED automation pipeline 344. The FED automation pipeline 344 may output a type of computing device to be utilized or intermediate output (e.g., the intermediate output indicating a type of computing device), as described herein. The formulation circuitry 338 or engine may include FED task initialization instructions 342. The FED task initialization instructions 342 may receive all or a portion of the parsed data, as well as the type of computing device to be utilized or intermediate output. Based on the parsed data and/or the type of computing device to be utilized or intermediate output, the FED task initialization instructions 342 may set up or initiate the FED task. Such set up or initialization may include locating and selecting computing devices of the determined type(s). Once the computing devices are located and selected, the FED task initialization instructions 342 may transmit all or a portion of the parsed data to selected computing devices.

As illustrated in FIG. 3B, the apparatus 300 may include runtime circuitry 348. The runtime circuitry 348 may generate either a quantum algorithm 350, a hybrid algorithm 356 (utilizing both quantum and classical computing algorithms), or a classical computing algorithm 358, based on the type of computing device or intermediate output described earlier. In an example, the apparatus 300 may consider, when generating a quantum algorithm 350, the tensor product of the computational basis and unitary transformations that may make up a quantum algorithm. Further, the quantum algorithm 350 generation may include an amplitude and/or phase estimation. In another example, the classical computing algorithm 358 may include classical post-processing and preparation of parameters or integration of measured classical data as part of classical post-processing. For example, parameters utilized for a quantum algorithm 350 may be revised via the classical computing algorithm 358. The revised parameters may be transmitted back to the quantum computing device 352 for further quantum processing via the quantum algorithm 350 with revised parameters. Once an algorithm is generated, the algorithm may be executed on the corresponding computing device (e.g., a quantum algorithm at 350 on a quantum computing device 352, a classical computing algorithm 358 on a classical computing device 360, or both). In another example, if a user enters a general software solution solely or with a particular problem, the generated algorithm may be based, at least in part, on the general software solution. The output from such systems may be measured (e.g., at measure output 354) and/or recorded (e.g., at record output 362) and transmitted back to the formulation circuitry 338 or engine for packaging and delivery at 346. The formulation circuitry 338 or engine may transmit the package to the Launchpad 302 for display or download.

As noted above and as illustrated in FIG. 3C, the formulation circuitry 338 or engine may include a FED automation pipeline 344. As parsed data is transmitted from the parser 340 to the FED automation pipeline 344 (see point 364), all of or a portion of the parsed data may be transmitted to data preparation circuitry 368. As noted, the data preparation circuitry 368 may prepare or pre-process the parsed data or the portion of the parsed data. The data preparation circuitry may adjust (e.g., weight different characteristics, remove certain data points, etc.) or format the data prior to applying the parsed data to the machine learning model 370 or classifier. After the preparation or pre-processing is complete, the prepared or pre-processed data may be transmitted to the machine learning model 370. The machine learning model 370 may produce and output a number, classification, and/or prediction. Such an output may be transported to the FED task chain 372. Based on the value of the output, the FED task chain 372 may determine the type of computing device to utilize for the input problem or may determine an intermediate output. The intermediate output may indicate a type of computing device to utilize for an input. The determined type of computing device or intermediate output may be transmitted to FED task initialization instructions 342, either directly or via the parser 340. The determination or intermediate output may also be utilized to re-train or fine tune the machine learning model 370. After output of the determination or intermediate output from the FED task chain 372, the determination or intermediate output may be further processed via tools 374 (e.g., toolchains or application platforms).

The tools 374 may prepare the output, based on the determination or intermediate output, for execution on the relevant runtime circuitry. For example, the output may be a quantum compute task and the target runtime circuitry may be an IBMQ system. In such an example, the tools may be retrieved from IBM Qiskit or similar platform that will transform the output for a workflow on the IBMQ System. In another example, the output may be a hybrid computing task and the target runtime circuitry may be the IBMQ system for quantum compute and a classical computing device (e.g., an x86 system or server) for classical compute. The tools 374 for handling the classical compute portion of the task may consist of a toolchain, such as the GNU Compiler Collection (GCC), while the tools for quantum compute may consist of or be retrieved from IBM Qiskit or a similar platform. The tools 374 may provide the following functions: (i) building source code (e.g., transforming an output to source code); (ii) compiling source code to prepare executable(s) (e.g., compile source code to object code for classical compute or circuits for quantum compute; (iii) run the executables, either on the classical computing device or the compiled circuits, which may be either local or cloud-based; (iv) analyze the outcome of the execution (e.g., execution via classical compute and/or quantum compute); and (v) store the outcome which may be obtained either by measuring on quantum compute and/or recording the outcome on classical compute. After further processing via tools 374, the processed determination, the original parsed data, and the output of runtime circuitry 348 (e.g., via point 366) may be transmitted to evaluation instructions 376. The evaluation instructions 376 may, when executed by the formulation circuitry 338, determine which sections of a particular problem utilized quantum computing devices and/or classical computing devices. The evaluation instructions 376 may, when executed by the formulation circuitry 338, perform such determinations of a pattern based on matrix elements, free parameters, state preparation of inputs, and/or measurement, to identify variational quantum circuits. The evaluation data may be utilized by the formulation circuitry 338 when executing the retraining instructions 378. Other data may be utilized by the formulation circuitry 338 when executing the retraining instructions 378, such as the input associated with the output of runtime circuitry 348 and/or the FED data instructions 318 input by the user. The retraining instructions 378 may, when executed by the formulation circuitry 338, determine whether to re-train or fine-tune the machine learning model or classifier based on the evaluation data, the output, the input associated with the output of runtime circuitry 348, and/or the FED data instructions 318 input by the user. If the machine learning model or classifier is to be re-trained, the evaluation data may be transmitted to the machine learning model or classifier.

In some embodiments, various components of the apparatuses 200 and 300 may be hosted remotely (e.g., by one or more cloud servers) and thus need not physically reside on the corresponding apparatus 200 or 300. Thus, some or all of the functionality described herein may be provided by third party circuitry. For example, a given apparatus 200 or 300 may access one or more third party circuitries via any sort of networked connection that facilitates transmission of data and electronic information between the apparatus 200 or 300 and the third party circuitries. In turn, that apparatus 200 or 300 may be in remote communication with one or more of the other components describe above as comprising the apparatus 200 or 300.

As will be appreciated based on this disclosure, example embodiments contemplated herein may be implemented by an apparatus 200 or 300. Furthermore, some example embodiments may take the form of a computer program product comprising software instructions stored on at least one non-transitory computer-readable storage medium (e.g., memory 204). Any suitable non-transitory computer-readable storage medium may be utilized in such embodiments, some examples of which are non-transitory hard disks, CD-ROMs, flash memory, optical storage devices, and magnetic storage devices. It should be appreciated, with respect to certain devices embodied by apparatus 200 as described in FIG. 2 or apparatus 300 as described in FIGS. 3A-3C, that loading the software instructions onto a computing device or apparatus produces a special-purpose machine comprising the means for implementing various functions described herein.

Having described specific components of example apparatuses 200 and 300, example embodiments of the present disclosure are described below in connection with a series of graphical user interfaces and flowcharts.

Graphical User Interface

Figure 4B:
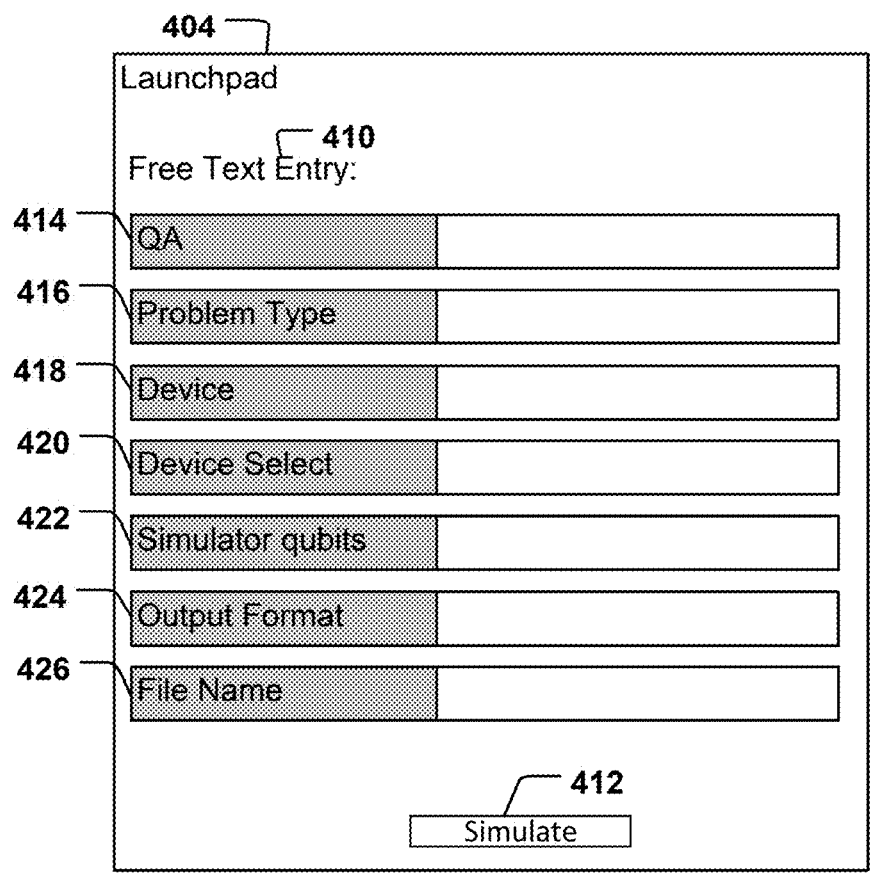

Each of FIGS. 4A and 4B illustrates an example graphical user interface (GUI) enabling a system to generate and execute algorithms for determined types of computing devices. As noted previously, a user may interact with the user interface or interactive modalities of the FED system 102 by directly engaging with input-output circuitry 208 of an apparatus 200 comprising a system device 104 of the FED system 102. In such an embodiment, the GUI 402 shown in FIGS. 4A and 4B may be displayed to a user by the apparatus 200 or apparatus 300. Alternatively, a user may interact with the FED system 102 using a separate user interface (e.g., via any of user device 110A through user device 110N, as shown in FIG. 1), which may communicate with the FED system 102 via communications network 108. In such an embodiment, the GUIs 402 and 404 shown in FIG. 4A and FIG. 4B, respectively, may be displayed to the user.

The GUI 402 of FIG. 4A may include one or more different types of interaction modalities or inputs. A user may input data in one of the one or more interaction modalities or inputs. For example, a user may click 'browse files' 406 and select an appropriate file, select drag and drop entry 408, or select free text entry 410. In response to a selection of drag and drop entry 408, the user may be directed to a separate GUI including a blank space and drag and drop options. The user may place the options relevant to a particular problem in the blank space. In response to a selection of free text entry 410, the user may be redirected to a free text entry GUI 404, as shown in FIG. 4B. The free text entry GUI 404 may include a list of potential options. Each may include a free text box or dropdown menu. For example, the options may include inputting a QA 414, a problem or problem type 416, a software solution, a device 418 and/or device selection 420 option, simulator qubits 422, an output format 424, and/or a file name 426.

In an embodiment, the GUI for any data input options may include predictive algorithms. For example, the free text entry GUI 404 may include a predictive algorithm. The predictive algorithm may automatically populate fields based on data input into another field. In such examples, as a user enters a type of QA 414, the predictive algorithm may automatically populate one or more of the remaining blank text fields 416-422. The user may then adjust each automatically populated text field as desired.

Upon entry of the data, the user may select simulate 412 and an output may be generated as described above.

Example Operations

Figure 5:
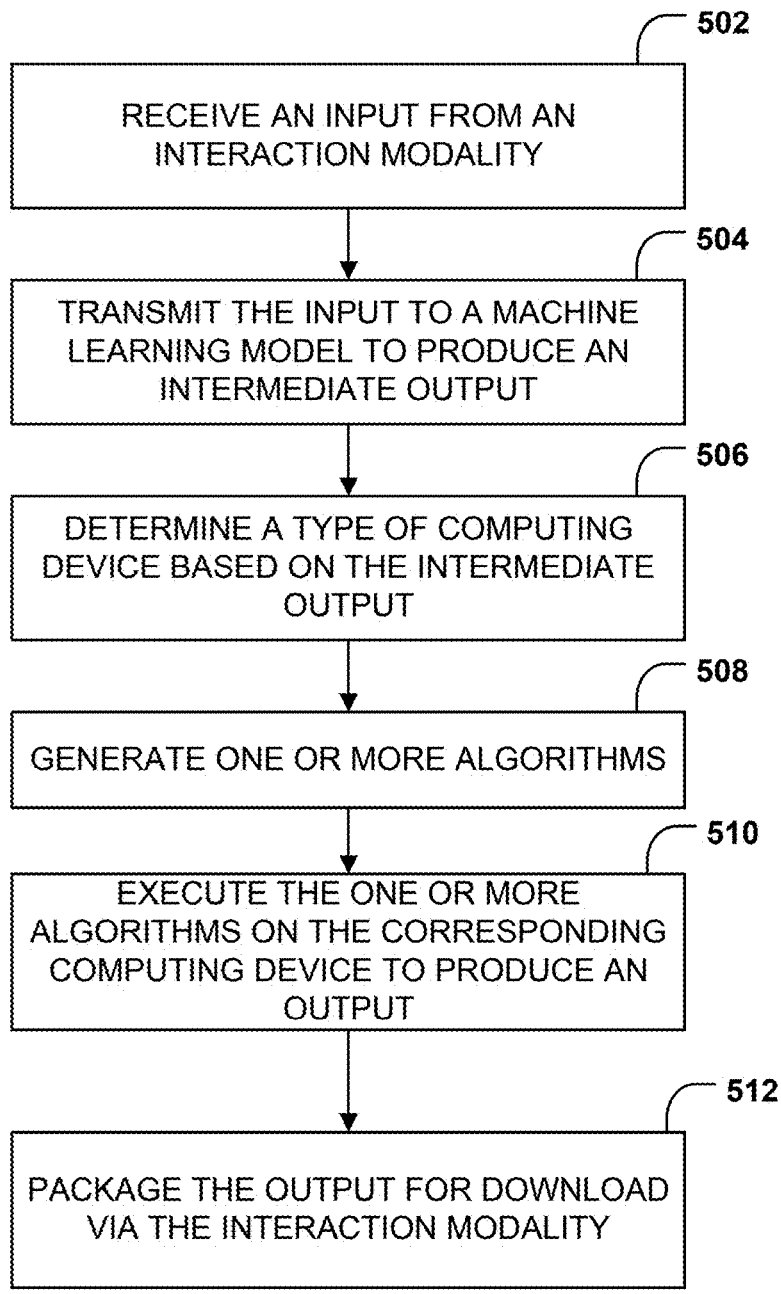
FIG. 5 illustrates an example flowchart for generating an output from a determined type of computing device, in accordance with some example embodiments described herein.
Figure 6:
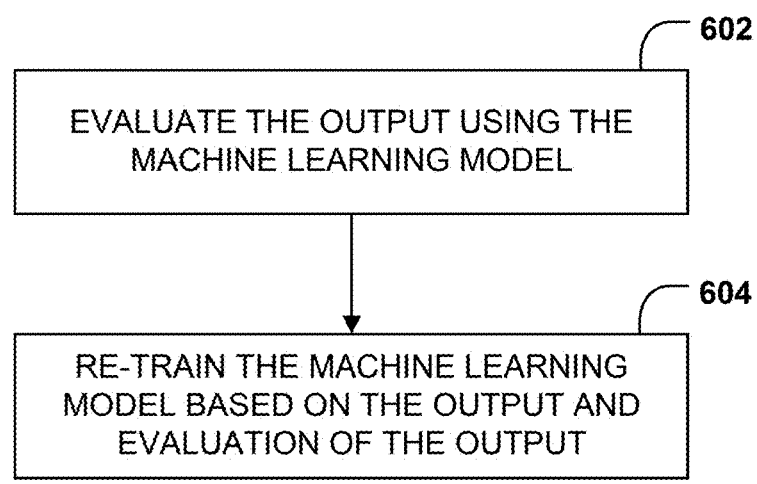
FIG. 6 illustrates an example flowchart for re-training a machine learning model with the generated output, in accordance with some example embodiments described herein.

Turning to FIGS. 5 and 6, example flowcharts are illustrated that contain example operations implemented by example embodiments described herein. The operations illustrated in FIGS. 5 and 6 may, for example, be performed by system device 104 of the FED system 102 shown in FIG. 1, which may in turn be embodied by an apparatus 200, which is shown and described in connection with FIGS. 2 through 3C. To perform the operations described below, the apparatus 200 or 300 may utilize one or more of processing circuitry 202, memory 204, communications circuitry 206, input-output circuitry 208, formulation circuitry 210, first runtime circuitry 212, second runtime circuitry 214, and/or any combination thereof. It will be understood that user interaction with the FED system 102 may occur directly via input-output circuitry 208, as shown in FIG. 1, or may instead be facilitated by a computing device, and which may have similar or equivalent physical componentry facilitating such user interaction.

Meanwhile, the various operations described in connection with FIG. 6 may be performed by apparatus 300, which may utilize one or more of processing circuitry, memory, communications circuitry, input-output circuitry, formulation circuitry 338, runtime circuitry 348, and/or any combination thereof.

Turning first to FIG. 5, example operations are shown for low-code utilization of a computing system involving a classical computing device and a quantum computing device. The output of such operations may be in a format suitable for ease of user interpretation. The type of computing device may include a quantum computing device, a classical computing device, or a combination thereof (e.g., a hybrid computing device).

As shown by operation 502, the apparatus 200 includes means, such as memory 204, communications circuitry 206, input-output circuitry 208, and/or the like, for receiving an input from an interaction modality. The input may have previously been stored by the apparatus 200, in which case receipt of the input may comprise retrieval of the previously stored input from memory 204. The communications circuitry 206, however, may facilitate receipt of the input from a remote device separate from apparatus 200 (e.g., one of user devices 110A-110N). The input-output circuitry 208 may facilitate receipt of the input from a user interacting directly with the apparatus 200. When received via communications circuitry 206 or input-output circuitry 208, the input may be received via an interaction modality in one or more different ways. For instance, the FED system or apparatus 200 may receive the input as a text file (e.g., .INI or a script file), free text, or other format.

As shown by operation 504, the apparatus 200 includes means, such as formulation circuitry 210, and/or the like, for transmitting the input to a machine learning model to produce an intermediate output. The intermediate output may indicate a type of computing device to be utilized. The input may be pre-processed or prepared by the formulation circuitry 210 prior to transmission to the machine learning model. Such pre-processing or preparation may be performed without knowledge of the user. The model, as described above, may be any of a variety of machine learning models.

As shown by operation 506, the apparatus 200 includes means, such as first runtime circuitry 212 or the like, for determining a type of computing device. The type of computing device may include a quantum computing device, a classical computing device, or a combination thereof (e.g., a hybrid computing device). Such a determination may be made based on the intermediate output of the machine learning model. Other factors may be taken into consideration within the machine learning model, such as whether a quantum computing device provides sufficient speedup of algorithm execution. The quantum computing device may not be chosen if the benefits are outweighed by the cost.

As shown by operation 508, the apparatus 200 includes means, such as first runtime circuitry 212 or the like, for generating one or more algorithms. The algorithms may be generated based on the output of the model.

As shown by operation 510, the apparatus 200 includes means, such as second runtime circuitry 214 or the like, for executing the one or more algorithms on the corresponding computing device to produce an output. For example, the second runtime circuitry 214 may transmit the one or more generated algorithms to a corresponding computing device (e.g., a quantum computing device and/or classical computing device). The algorithm may be executed on the corresponding computing device and the resulting output may be transmitted to the second runtime circuitry 214. In addition to the one or more algorithms being transmitted to a corresponding computing device, the second runtime circuitry 214 may transmit instructions indicating how, when, and/or any other data related to the execution of the one or more algorithms. Such transmissions, as described, may occur via the communications circuitry 206. In an embodiment, the output produced may include a number, a probability, a model, a set of data, charts, graphs, graphics, and/or other data.

Finally, as shown by operation 512, the apparatus 200 includes means, such as formulation circuitry 210 or the like, for packaging the output for download via the interaction modality. Packaging the output may include converting the output into a readable format. Packaging the output may further include creating a file or document suitable for displaying data (e.g., probabilities, charts, models, graphs, graphics, and/or other data). Further, packaging the output may include compressing any data or created files to limit the size of the package. For example, an output may include a probability and several charts. The formulation circuitry 210 may add the probability and several charts to a spreadsheet type file. Depending on the size of the spreadsheet file, as well as any other corresponding files created, the formulation circuitry 210 may compress the spreadsheet file and any other files created, thereby creating a package for download.

Turning next to FIG. 6, example operations are shown for re-training or fine-tuning the machine learning model.

As shown by operation 602, the apparatus 200 includes means, such as formulation circuitry 210 or the like, for evaluating the output. Such an evaluation may include determining whether to utilize the output to retrain the machine learning model. Such an evaluation may be performed by a user and/or the formulation circuitry 210.

Finally, such an evaluation may be based on various factors other than or including the output. For example, the evaluation may be based on runtime (e.g., the time taken to execute the one or more algorithms), error rates either included with the output or generated separately, resource utilization related to the type of computing device used to execute the one or more algorithms, and/or other factors.

Finally, as shown by operation 604, the apparatus 200 includes means, such as processing circuitry 202, memory 204, communications circuitry 206, input-output circuitry 208, formulation circuitry 210, first runtime circuitry 212, second runtime circuitry 214, or the like, for retraining the machine learning model based on the output and the evaluation of the output.

As described above, example embodiments provide methods and apparatuses that enable ease of quantum computing device generation and use. Example embodiments thus provide tools that overcome the problems faced by new users with little to no knowledge of creating and executing quantum algorithms or quantum circuits, thus rather than requiring large amounts of training or a learning curve, any user may be able to utilize quantum computing or even a hybrid algorithm utilizing both classical computing device and quantum computing devices. Further, such mapping reduces the potential for human error or mistake in creating a quantum computing device. Moreover, embodiments described herein avoid such human errors and significant downtime in preparing such systems or algorithms. Further, rather than simply always using a quantum computing device, the machine learning model described above may allow for a user to utilize the appropriate type for computing device for a particular problem.

As these examples all illustrate, example embodiments contemplated herein provide technical solutions that solve real-world problems faced during quantum computing algorithm generation. And while quantum computing algorithm generation has been an issue for some time, the recently expansion of available quantum computing devices today has made this problem significantly more acute, as the demand for faster analysis has grown significantly even while the complexity of quantum computing remains high. At the same time, the recently arising ubiquity of machine learning and mapping has unlocked new avenues to solving this problem that historically were not available, and example embodiments described herein thus represent a technical solution to these real-world problems.

FIGS. 5 and 6 illustrate operations performed by apparatuses, methods, and computer program products according to various example embodiments. It will be understood that each flowchart block, and each combination of flowchart blocks, may be implemented by various means, embodied as hardware, firmware, circuitry, and/or other devices associated with execution of software including one or more software instructions. For example, one or more of the operations described above may be embodied by software instructions. In this regard, the software instructions which embody the procedures described above may be stored by a memory of an apparatus employing an embodiment of the present invention and executed by a processor of that apparatus. As will be appreciated, any such software instructions may be loaded onto a computing device or other programmable apparatus (e.g., hardware) to produce a machine, such that the resulting computing device or other programmable apparatus implements the functions specified in the flowchart blocks. These software instructions may also be stored in a computer-readable memory that may direct a computing device or other programmable apparatus to function in a particular manner, such that the software instructions stored in the computer-readable memory produce an article of manufacture, the execution of which implements the functions specified in the flowchart blocks. The software instructions may also be loaded onto a computing device or other programmable apparatus to cause a series of operations to be performed on the computing device or other programmable apparatus to produce a computer-implemented process such that the software instructions executed on the computing device or other programmable apparatus provide operations for implementing the functions specified in the flowchart blocks.

The flowchart blocks support combinations of means for performing the specified functions and combinations of operations for performing the specified functions. It will be understood that individual flowchart blocks, and/or combinations of flowchart blocks, can be implemented by special purpose hardware-based computing devices which perform the specified functions, or combinations of special purpose hardware and software instructions.

In some embodiments, some of the operations above may be modified or further amplified. Furthermore, in some embodiments, additional optional operations may be included. Modifications, amplifications, or additions to the operations above may be performed in any order and in any combination.

Conclusion

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for low-code utilization of a computing system involving a classical computing device and a quantum computing device, the method comprising:
    receiving, by input-output circuitry, a computational problem, wherein a solution to the computational problem is obtainable via classical computing, quantum computing, or hybrid computing;
    parsing, by a formulation circuitry, the computational problem to produce a machine learning model input, wherein the machine learning input comprises an identifier of an algorithm;
    determining, by a machine learning model, an indication of a hardware processor device based on the machine learning model input, wherein the machine learning model is trained to select a training hardware processor device for a training computational problem based on a performance factor, wherein the hardware processor device is one of a hybrid computing device, a quantum computing device, and a classical computing device;

generating, by a first runtime circuitry, one or more algorithms based on the computational problem and the determined hardware processor device;

executing, by a second runtime circuitry, the one or more algorithms on one or more corresponding computing devices to produce an output; and packaging, by the input-output circuitry, the output for transmission.

2. The method of claim 1, wherein the hybrid computing device includes a quantum computing device and a classical computing device.

3. The method of claim 2, wherein, in an instance in which the indication of the hardware processor device identifies the quantum computing device and the classical computing device, the generated one or more algorithms include a quantum algorithm and a classical computing algorithm.

4. The method of claim 3, further comprising:
executing, by the second runtime circuitry, the quantum algorithm on a quantum circuitry to produce an initial output; and
executing, by the second runtime circuitry, the classical computing algorithm with the initial output on the classical computing device to produce the output.

5. The method of claim 1, wherein the input-output circuitry includes one or more user interfaces.

6. The method of claim 5, wherein the one or more user interfaces are configured to allow an input of a low coding text file, a drag and drop coding solution, or a free form text file.

7. The method of claim 6, further comprising:
parsing, by a formulation circuitry, an input into one or more values corresponding to key value pairs,
wherein the one or more values corresponding to key value pairs comprise the computational problem.

8. The method of claim 1, further comprising:
evaluating, by a formulation circuitry, the output using the machine learning model; and
re-training, by the formulation circuitry, the machine learning model based on the output and an evaluation of the output.

9. An apparatus for low-code utilization of a computing system involving a classical computing device and a quantum computing device, the apparatus comprising:
input-output circuitry configured to:
receive a computational problem, wherein a solution to the computational problem is obtainable via classical computing, quantum computing, or hybrid computing;
formulation circuitry configured to:
parse the computational problem to produce a machine learning model input, wherein the machine learning input comprises an identifier of an algorithm;
a machine learning model trained to select a training hardware processor device for a training computational problem based on a performance factor, configured to:
determine an indication of a hardware processor device based on the machine learning model input, wherein the hardware processor device is one of a hybrid computing device, a quantum computing device, and a classical computing device;
first runtime circuitry configured to:
generate one or more algorithms based on the computational problem and the determined hardware processor device; and second runtime circuitry configured to:
execute the one or more algorithms on one or more corresponding computing devices to produce an output,
wherein the input-output circuitry is further configured to package the output for transmission.

10. The apparatus of claim 9, wherein, in an instance in which the indication of the hardware processor device identifies a quantum computing device and a classical computing device, the generated one or more algorithms include a quantum algorithm to be executed on a quantum circuitry and a classical computing algorithm to be executed on the classical computing device.

11. The apparatus of claim 10, wherein the second runtime circuitry is further configured to:
execute the quantum algorithm to produce an initial output; and
execute the classical computing algorithm using the initial output to produce the output.

12. The apparatus of claim 9, wherein the quantum computing device includes one or more of a quantum computing simulator and physical quantum computing device.

13. The apparatus of claim 9, wherein the input-output circuitry is further configured to transmit the output back to the machine learning model for re-training.

14. The apparatus of claim 9, wherein the hybrid computing device includes a quantum computing device and a classical computing device.

15. The apparatus of claim 9, wherein the input-output circuitry includes one or more user interfaces, wherein the one or more user interfaces are configured to allow an input of a low coding text file, a drag and drop coding solution, or a free form text file.

16. A computer program product for low-code utilization of a computing system involving a classical computing device and a quantum computing device, the computer program product comprising at least one non-transitory computer-readable storage medium storing software instructions that, when executed, cause an apparatus to:
receive a computational problem;
determine an indication of a hardware processor device needed for the computational problem, wherein the determination uses a machine learning model trained to classify computational problems, wherein the hardware processor device is one of a hybrid computing device, a quantum computing device, and a classical computing device;
generate one or more algorithms based on the computational problem and the determined hardware processor device;
execute the one or more algorithms on one or more corresponding computing device to produce an output; and
package the output for transmission.

17. The computer program product of claim 16, wherein the computational problem is specified using one of a .INI file, a shell script, and a text file.

18. The computer program product of claim 16, wherein the software instructions, when executed, further cause the apparatus to:
generate a drag and drop user interface to allow a user to enter the computational problem.

19. The computer program product of claim 16, wherein receiving the computational problem utilizes one or more interactive modalities to allow a user to enter the computational problem.

20. The computer program product of claim 16, wherein the computational problem includes a type of algorithm, a problem type, a device type, a number of qubits, an output format, and a file name.

* * * * *